United States Patent
Imanishi et al.

(10) Patent No.: US 6,417,519 B1
(45) Date of Patent: Jul. 9, 2002

(54) FIELD EFFECT TRANSISTOR WITH SUPPRESSED THRESHOLD CHANGE

(75) Inventors: Kenji Imanishi; Tsuyoshi Takahashi, both of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/565,486

(22) Filed: May 5, 2000

(30) Foreign Application Priority Data

Jul. 26, 1999 (JP) ............................................ 11-211118

(51) Int. Cl.⁷ ................................................ H01L 29/12
(52) U.S. Cl. ............................... 257/11; 257/192; 257/9
(58) Field of Search ........................ 257/192, 9; 357/22; 438/172

(56) References Cited

U.S. PATENT DOCUMENTS 6,090,649 A * 6/2000 Suemitsue et al. .......... 438/172
6,140,169 A * 10/2000 Kawai et al. ................ 438/197
6,274,893 B1 * 8/2001 Igarashi et al. ............. 257/192

* cited by examiner

*Primary Examiner*—David Nelms
*Assistant Examiner*—Thinh Nguyen
(74) *Attorney, Agent, or Firm*—Armstrong, Westerman & Hattori, L.L.P.

(57) ABSTRACT

A carrier transit layer made of group III–V compound semiconductor is formed on a semiconductor substrate. A carrier supply layer is formed on the carrier transit layer. The carrier supply layer supplies carriers for generating two-dimensional carrier gas in an interface between the carrier supply layer and carrier transit layer. The carrier supply layer is made of group III–V compound semiconductor which contains In as group III element. A gate electrode is disposed above a partial area of the carrier supply layer. An intermediate layer is disposed between the gate electrode and carrier supply layer. The intermediate layer is made of group III–V compound semiconductor not containing In as group III element. An ohmic electrode is disposed on both sides of the gate electrode.

11 Claims, 1 Drawing Sheet

FIELD EFFECT TRANSISTOR WITH SUPPRESSED THRESHOLD CHANGE

This application is based on Japanese Patent Application HEI 11-211118, filed on Jul. 26, 1999, the entire contents of which are incorporated herein by reference.

BACKGROUND OF THE INVENTION a) Field of the Invention

The present invention relates to a semiconductor device, and more particularly to a semiconductor device in which an amount of carriers moving in a carrier transit layer made of group III–V compound semiconductor is controlled by voltage applied to the gate electrode.

b) Description of the Related Art

With recent demands for high speed and high performance of a computer system and a communication system, developments are progressing on a high electron mobility transistor (HEMT) using group III–V compound semiconductor.

A conventional HEMT of InP series will be described below. An InP HEMT uses an InP substrate, and InGaAs as its electron transit layer, and n-type InAlAs as its electron supply layer. On the electron supply layer, a contact layer of n-type InGaAs is formed. A gate electrode is in Schotky contact with the supply layer. Source and drain electrodes are in ohmic contact with the contact layer. Between the gate electrode and n-type InAlAs electron supply layer, an undoped InAlAs layer is inserted in some cases in order to reduce gate leak current.

An InP layer is inserted in some cases between the n-type InGaAs contact layer and undoped InAlAs layer in order to precisely control the threshold voltage. InP has resistance to chemical etching different from InAlAs and InGaAs. With this structure, it is possible to remove the n-type InGaAs contact layer in the gate contact area with good controllability and expose the underlying InP layer and undoped InAlAs layer. The gate electrode contacts the exposed InP layer or undoped InAlAs layer.

A threshold voltage may decrease after the long-term operation of an InP HEMT.

SUMMARY OF THE INVENTION

It is an object of the present invention to reduce a change in the threshold voltage and improve reliability of a field effect transistor having a group III–V compound semiconductor which contains In.

According to one aspect of the present invention, there is provided a semiconductor device comprising: a semiconductor substrate; a carrier transit layer including group III–V compound semiconductor and formed on said semiconductor substrate; a carrier supply layer including group III–V compound semiconductor containing In as group III element and formed on said carrier transit layer, said carrier supply layer supplying carriers for generating two-dimensional carrier gas in an interface between said carrier supply layer and said carrier transit layer; a gate electrode disposed above a partial area of said carrier supply layer for controlling a potential in said carrier transit layer; an intermediate layer disposed between said gate electrode and said carrier supply layer and including group III–V compound semiconductor not containing In as group III element; and a pair of ohmic electrodes disposed on both sides of said gate electrode for flowing current through said carrier transit layer.

Since the intermediate layer not containing In is inserted between the gate electrode and carrier supply layer, the gate electrode will not contact an In containing semiconductor layer. Accordingly, it is possible to prevent a change in the threshold voltage to be caused by instability of an interface between the gate electrode and In containing semiconductor layer.

DETAILED DESCRIPTION OF THE PREFERRED EMBODIMENTS

Figure 1:
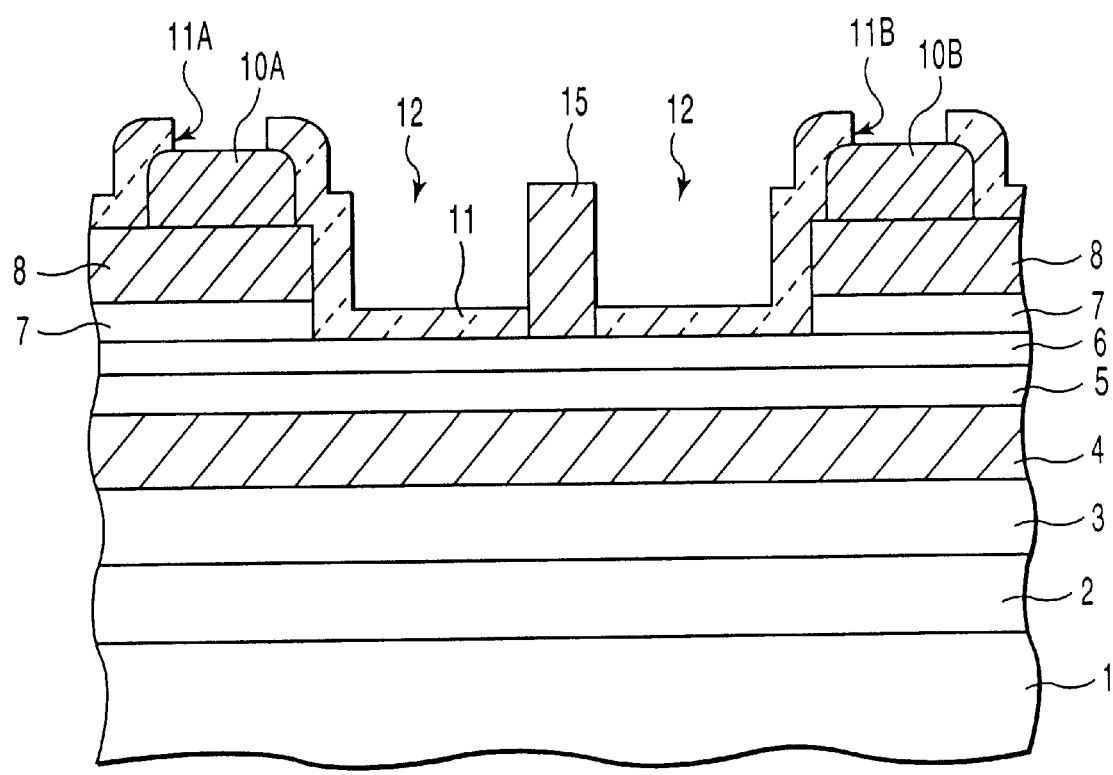
FIG. 1 is a cross sectional view showing a HEMT according to an embodiment of the invention.

Prior to describing embodiments of the invention, the factors of changing a threshold voltage of conventional InP HEMTs will be described.

A GaAs HEMT has a change in the threshold voltage smaller than that of an InP HEMT. From this fact, the present inventors considered that instability at the interface between an In containing semiconductor layer and a gate electrode results in a change in the threshold voltage. As the surface of compound semiconductor which contains In as group III element is oxidized, electrically conductive indium oxide ($In_2O_3$) is formed on the surface. It can be presumed that if oxygen is left in the interface between the gate electrode and In containing semiconductor layer, indium oxide is formed in the interface during the operation of HEMT.

The indium oxide formed in the interface may generate gate leak current. In addition, the effective boundary plane between the gate electrode and semiconductor layer is shifted toward the semiconductor layer. These may be ascribed to the lowered threshold voltage. In the embodiment to follow, formation of indium oxide in the interface between a gate electrode and semiconductor layer can be prevented.

FIG. 1 is a cross sectional view of a HEMT according to an embodiment of the invention. On the surface of an InP substrate 1, a buffer layer 2, an electron transit layer 3, an electron supply layer 4, a barrier layer 5, an intermediate layer 6, a stopper layer 7 and a contact layer 8 are formed in this order from the bottom. The buffer layer 2 is made of undoped InAlAs and has a thickness of 200 nm. The electron transit layer 3 is made of undoped InGaAs and has a thickness of 25 nm.

The electron supply layer 4 is made of InAlAs doped with Si ($5 \times 10^{18}$ cm$^{-3}$) and imparted with n-type conductivity and has a thickness of 10 nm. The barrier layer 5 is made of undoped InAlAs and has a thickness of 10 nm. The intermediate layer 6 is made of undoped GaAsSb and has a thickness of 5 nm The stopper layer 6 is made of undoped InP and has a thickness of 5 nm. The contact layer 8 is made of InGaAs doped with Si ($1 \times 10^{19}$ cm$^{-3}$) and imparted with n-type conductivity and has a thickness of 50 nm. These layers are lattice matched with the InP substrate 1.

A recess 12 is formed through the two layers, the contact layer 8 and stopper layer 7. The intermediate layer 6 is exposed on the bottom of the recess 12. A gate electrode 15 contacts a partial bottom area of the recess 12. The gate electrode 15 is made of Al. A first ohmic electrode 10A and a second ohmic electrode 10B are formed on the contact layer 8 on both sides of the recess 12. The first and second ohmic electrodes 10A and 10B each have a three-layer structure laminating Ti, Pt and Au in this order from the bottom. The first and second ohmic electrodes 10A and 10B are made in ohmic contact with the lower level electron transit layer 4.

A passivation film 11 covers the surfaces of the contact layer 8, stopper layer 7 and intermediate layer 6. The passivation film 11 is made of SiN.

Two-dimensional electron gas is accumulated in the interface between the electron transit layer 3 and electron supply layer 4. Strictly, the two-dimensional electron gas is accumulated in the electron transit layer 3 near the interface between the electron transit layer 3 and electron supply layer 4. Current flows between the first and second ohmic electrodes 10A and 10B by means of the two-dimensional electron gas. The potential of the lower level electron transit layer 3 changes with a voltage applied to the gate electrode 15. As the potential changes, the concentration of the two-dimensional electron gas changes so that the current flowing between the first and second ohmic electrodes 10A and 10B can be controlled.

Next, a method of manufacturing the HEMT having the structure shown in FIG. 1 will be described. The layers from the buffer layer 2 to the contact layer 8 are formed by metal organic chemical vapor deposition (MOCVD). Trimethylindium (TMIn) is used as the source material of In, trimethylaluminum (TMAl) is used as the source material of Al, triethylgalium (TEGa) is used as the source material of Ga, trimethylantimony (TMSb) is used as the source material of Sb, arsine ($AsH_3$) is used as the source material of As, and phosphine ($PH_3$) is used as the source material of P. Disilane ($Si_2H_6$) is used as the dopant for Si. The growth conditions are 0.1 atmospheric pressure (or 80 Torr) and about 700° C. in temperature.

After the contact layer 8 is formed, three layers of Ti, Pt and Au are evaporated. These three layers are patterned to leave the first and second ohmic electrodes 10A and 10B.

The contact layer 8 and stopper layer 7 are partially etched to form the recess 12. The contact layer 8 is etched with mixed solution of phosphoric acid and hydrogen peroxide. This etchant hardly etches InP so that the InP stopper layer 7 functions as an etching stopper. The stopper layer 7 is etched with aqueous solution of hydrochloric acid or mixed solution of hydrochloric acid and phosphoric acid. This etchant hardly etches the GaAsSb intermediate layer so that etching can be stopped at the upper surface of the intermediate layer 6 with good reproductivity.

The stopper layer 7 may be made of group III–V compound semiconductor having resistance to chemical etching different from that of the intermediate layer 6 and contact layer 8. For example, if the intermediate layer 6 and contact layer 8 are made of compound semiconductor including As as group V element, the stopper layer 7 may be made of compound semiconductor including P as group V element.

The passivation film 11 of SiN covers the whole substrate surface. For example, the passivation film 11 is formed through CVD. The passivation film 11 is covered with a resist film, and an opening corresponding to the gate electrode 15 is formed through the resist film. The passivation film 11 exposed in this opening is etched. The passivation film 11 may be wet-etched by using hydrofluoric acid or dry-etched by using $SF_6$.

An Al film is deposited over the whole substrate surface, and the gate electrode 15 is formed through lift-off. Openings 11A and 11B are formed through the passivation film 11 to expose a partial top surface of the first and second ohmic electrodes 10A and 10B.

In HEMT of this embodiment, the gate electrode 15 is not in direct contact with the barrier layer 5 containing In. Since the intermediate layer 6 in direct contact with the gate electrode 15 does not contain In, indium oxide will not be formed in the interface between the gate electrode 15 and intermediate layer 6. Therefore, the threshold voltage is hard to be changed even the HEMT is operated for a long period.

The InAlAs barrier layer 5 of this embodiment raises a dielectric breakdown voltage between the gate electrode 15 and electron transit layer 3, and reduces gate leak current. If a sufficient dielectric breakdown voltage is ensured without the barrier layer 5, the barrier layer 5 is not necessarily required.

The intermediate layer 6 is inserted between the electron supply layer 4 and gate electrode 15 in order to prevent the gate electrode 15 from contacting the semiconductor layer containing In. Therefore, if the electron supply layer 4 is made of group III–V compound semiconductor containing In, inserting the intermediate layer 6 is effective. In this embodiment, although the electron supply layer 4 is made of InAlAs, it may be made of InP or the like.

Also in this embodiment, although the electron transit layer 3 is made of InGaAs, it may be made of other group III–V compound semiconductor such as InP.

Still also in this embodiment, although the intermediate layer 6 is made of GaAsSb, it may be made of other group III–V compound semiconductor not containing In as group III element. For example, it may be made of $Al_xGa_{1-x}As_{1-y}Sb_y$ where x and y are numbers satisfying $0 \leq x \leq 1$ and $0 \leq y \leq 1$. If an InP substrate is used, it is preferable to set y=0.5 in order to make the intermediate layer 6 lattice-match the InP substrate.

If the intermediate layer 6 is not made to lattice-match the substrate, the intermediate layer 6 is set to a critical thickness or thinner. The critical thickness means a maximum thickness until which a film can be epitaxially grown with the condition of a mirror growth surface. For example, if the intermediate layer 6 is to be made of AlGaAs, it is preferable to set the thickness of the intermediate layer 6 to 6 nm or thinner.

Also in this embodiment, although the cross section of the gate electrode 15 is rectangular, it may be of a T-character shape so that the electric resistance of the gate electrode can be lowered and the operation speed can be increased more.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:

a semiconductor substrate;

a carrier transit layer including group III–V compound semiconductor and formed on said semiconductor substrate;

a carrier supply layer including group III–V compound semiconductor containing In as group III element and formed on said carrier transit layer, said carrier supply layer supplying carriers for generating two-dimensional carrier gas in an interface between said carrier supply layer and said carrier transit layer;

a gate electrode disposed above a partial area of said carrier supply layer for controlling a potential in said carrier transit layer;

an intermediate layer disposed between said gate electrode and said carrier supply layer and including group III–V compound semiconductor not containing In as group III element to prevent the formation of Indium Oxide on the interface; and a pair of ohmic electrodes disposed on both sides of said gate electrode for flowing current through said carrier transit layer.

2. The semiconductor device according to claim 1, wherein said intermediate layer is comprised of $Al_xGa_{1-x}As_{1-y}Sb_y$ ($0 \leq x \leq 1$, $0 \leq y \leq 1$).

3. The semiconductor device according to claim 1, wherein each of the pair of ohmic electrodes includes a first layer in contact with said intermediate layer and a second layer formed on the first layer, and chemical etching resistance of the first layer is different from chemical etching resistance of the second layer.

4. The semiconductor device according to claim 2, wherein each of the pair of ohmic electrodes includes a first layer in contact with said intermediate layer and a second layer formed on the first layer, and chemical etching resistance of the first layer is different from chemical etching resistance of the second layer.

5. The semiconductor device according to claim 1, wherein said carrier transit layer is made of group III–V compound semiconductor containing In as group III element.

6. The semiconductor device according to claim 1, wherein said gate electrode is in direct contact with said intermediate layer.

7. semiconductor device comprising:

a group III–V compound semiconductor layer containing In as a group III element;

an electrode schottky contacting with said group III–V compound semiconductor layer; and an intermediate layer disposed between said electrode and said group III–V compound semiconductor layer, the intermediate layer not containing In as a group III compound to prevent the formation of Indium Oxide on the interface.

8. The semiconductor device according to claim 7, wherein said intermediate layer is comprised of $Al_xGa_{1-x}A_{1-y}Sb_y$ ($0 \leq x \leq 1$, $0 \leq y \leq 1$).

9. A semiconductor device according to claim 1, wherein said intermediate layer is made of AlxGa1-xAs1-ySby ($0 \leq x \leq 1$, $0 \leq y \leq 1$).

10. A semiconductor device according to claim 1, wherein the intermediate layer has a lattice constant matched to that of the semiconductor substrate.

11. A semiconductor device according to claim 1, further comprising a barrier layer disposed between the carrier supply layer and the intermediate layer and made of group III–V compound containing In as a group III element.

* * * * *